(12) United States Patent
Choi et al.

(10) Patent No.: US 12,374,777 B2
(45) Date of Patent: Jul. 29, 2025

(54) ANTENNA PACKAGE AND IMAGE DISPLAY DEVICE INCLUDING THE SAME

(71) Applicant: DONGWOO FINE-CHEM CO., LTD., Jeollabuk-do (KR)

(72) Inventors: Byung Jin Choi, Incheon (KR); Won Hee Lee, Incheon (KR); Jae Hyun Lee, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 70 days.

(21) Appl. No.: 17/956,025

(22) Filed: Sep. 29, 2022

(65) Prior Publication Data

US 2023/0027303 A1    Jan. 26, 2023

Related U.S. Application Data

(63) Continuation of application No. PCT/KR2021/004060, filed on Apr. 1, 2021.

(30) Foreign Application Priority Data

Apr. 2, 2020  (KR) .................. 10-2020-0040034

(51) Int. Cl.
*H01Q 1/50*  (2006.01)
*H01Q 1/22*  (2006.01)
(Continued)

(52) U.S. Cl.
CPC .......... *H01Q 1/2283* (2013.01); *H01Q 1/243* (2013.01); *H01Q 1/38* (2013.01); *H01Q 13/08* (2013.01)

(58) Field of Classification Search
CPC ........ H01Q 1/2283; H01Q 1/243; H01Q 1/38; H01Q 13/08; H01Q 1/1271; H01Q 1/364;
(Continued)

(56) References Cited

U.S. PATENT DOCUMENTS 6,052,086 A * 4/2000 Kudoh .................. H01Q 23/00
                                                    343/700 MS
6,252,560 B1 * 6/2001 Tanaka .................. H01Q 25/00
                                                    342/371
(Continued)

FOREIGN PATENT DOCUMENTS

CN      102394359 A    3/2012
CN      214589248 U   11/2021
(Continued)

OTHER PUBLICATIONS

International Search Report for PCT/KR2021/004060 mailed on Jul. 8, 2021.

*Primary Examiner* — Dimary S Lopez Cruz
*Assistant Examiner* — Bamidele A Immanuel
(74) *Attorney, Agent, or Firm* — The PL Law Group, PLLC (57) ABSTRACT

An antenna package according to an embodiment includes a plurality of antenna units including first antenna units and second antenna units, a circuit board electrically connected to the antenna units. The circuit board includes a core layer including a first surface and a second surface facing each other, a first circuit wiring disposed on the first surface of the core layer and electrically connected to the first antenna units, and a second circuit wiring distributed on the first and second surfaces of the core layer and electrically connected to the second antenna units. Antenna units of different resonance frequencies can be efficiently included in the package using the circuit wiring design.

15 Claims, 4 Drawing Sheets

(51) Int. Cl.
*H01Q 1/24* (2006.01)
*H01Q 1/38* (2006.01)
*H01Q 13/08* (2006.01)

(58) Field of Classification Search
CPC ........ H01Q 5/42; H01Q 9/0407; H01Q 21/08; H01Q 1/50; H01Q 1/242; H01Q 1/521; H01Q 1/46; H01Q 21/22; H01Q 25/00; H01Q 3/40; H05K 1/02; H05K 1/11; H05K 1/0216; H05K 1/0224; H05K 1/115
See application file for complete search history.

(56) References Cited

U.S. PATENT DOCUMENTS

| | | | | |
|---|---|---|---|---|
| 6,529,170 | B1* | 3/2003 | Nishizawa | H01Q 9/285 343/700 MS |
| 6,567,055 | B1* | 5/2003 | Oglesby | H01Q 21/08 343/700 MS |
| 9,640,858 | B1* | 5/2017 | Islam | H01Q 1/38 |
| 9,831,548 | B2* | 11/2017 | Timofeev | H01Q 25/002 |
| 10,476,149 | B1* | 11/2019 | Ueda | H01Q 21/08 |
| 2009/0174613 | A1* | 7/2009 | Liu | H01Q 1/243 343/702 |
| 2009/0231226 | A1* | 9/2009 | Quan | H01Q 21/061 343/893 |
| 2010/0103050 | A1* | 4/2010 | Shimizu | H01Q 5/321 343/700 MS |
| 2010/0117908 | A2* | 5/2010 | Lee | H01P 3/00 343/700 MS |
| 2017/0346156 | A1* | 11/2017 | Morris | H01Q 1/1271 |
| 2018/0241135 | A1* | 8/2018 | Furlan | H01Q 21/0075 |
| 2019/0173177 | A1* | 6/2019 | Johansson | H01Q 1/246 |
| 2019/0245263 | A1* | 8/2019 | Quarfoth | H01Q 5/30 |
| 2019/0245275 | A1* | 8/2019 | Hayashi | H01Q 1/52 |
| 2019/0319364 | A1* | 10/2019 | Yang | H01Q 9/0414 |
| 2020/0075512 | A1* | 3/2020 | Kaeding | H10B 12/00 |
| 2020/0083948 | A1* | 3/2020 | Lim | H04B 7/0814 |
| 2020/0091990 | A1* | 3/2020 | Ho | H01Q 21/062 |
| 2020/0227819 | A1* | 7/2020 | Oh | H04M 1/0266 |
| 2020/0227835 | A1* | 7/2020 | Kim | H01Q 21/065 |
| 2020/0251807 | A1* | 8/2020 | Oh | H01Q 9/0407 |
| 2020/0251825 | A1* | 8/2020 | Kim | H01Q 21/065 |
| 2020/0259245 | A1* | 8/2020 | Kim | H01Q 1/243 |
| 2020/0350668 | A1* | 11/2020 | Kim | H01Q 5/35 |
| 2020/0403315 | A1* | 12/2020 | Huh | H01Q 9/0407 |
| 2021/0126348 | A1* | 4/2021 | Kim | H01Q 1/38 |
| 2021/0320414 | A1* | 10/2021 | Kim | H01Q 3/36 |
| 2022/0006180 | A1* | 1/2022 | Oh | H01Q 1/364 |
| 2022/0037768 | A1* | 2/2022 | Zimmerman | H01Q 1/246 |
| 2022/0037789 | A1* | 2/2022 | Kim | H01Q 1/2283 |
| 2022/0302573 | A1* | 9/2022 | Choi | H01Q 1/48 |
| 2022/0312594 | A1* | 9/2022 | Park | H05K 1/0237 |
| 2023/0058014 | A1* | 2/2023 | Choi | H01Q 1/243 |

FOREIGN PATENT DOCUMENTS

| | | |
|---|---|---|
| JP | 08-250922 A | 9/1996 |
| JP | 2010-178244 A | 8/2010 |
| KR | 10-1284024 B1 | 7/2013 |
| KR | 10-2013-0095451 A | 8/2013 |
| KR | 10-1962820 B1 | 3/2019 |
| KR | 10-2020-0005010 A | 1/2020 |
| WO | WO 2013/067790 A1 | 5/2013 |

* cited by examiner

ANTENNA PACKAGE AND IMAGE DISPLAY DEVICE INCLUDING THE SAME

CROSS-REFERENCE TO RELATED APPLICATION AND CLAIM OF PRIORITY

The present application is a continuation application to International Application No. PCT/KR2021/004060, with an International Filing Date of Apr. 1, 2021, which claims priority to Korean Patent Application No. 10-2020-0040034 filed on Apr. 2, 2020 in the Korean Intellectual Property Office (KIPO), the entire disclosures of which are incorporated by reference herein.

BACKGROUND

1. Field

The present invention relates to an antenna package and an image display device including the same. More particularly, the present invention relates to an antenna package including an antenna device and a circuit board and an image display device including the same.

2. Description of the Related Art

As information technologies have been developed, a wireless communication technology such as Wi-Fi, Bluetooth, etc., is combined with a display device in, e.g., a smartphone form. In this case, an antenna may be combined with the display device to provide a communication function.

As mobile communication technologies have been rapidly developed, an antenna capable of operating a high frequency or ultra-high frequency communication is needed in the display device.

However, as a driving frequency of the antenna increases, a signal loss may also increase. Further, as a length of a transmission path increases, the signal loss may further increase.

When different antenna units corresponding to a plurality of frequency bands are included in one device, a plurality of circuit boards may be required for a circuit connection. Accordingly, total volume and thickness of an antenna device or an antenna package may be increased.

On the contrary, when circuits connected to different antenna units are included in one circuit board, a signal reliability may be degraded due to a mutual interference between the circuits, and the length of the transmission path may be increased, thereby increasing the signal loss.

Thus, an antenna design for implementing the circuit connection to the antenna units of different frequencies with high reliability within a limited space is needed. For example, Korean Published Patent Application No. 2013-0095451 discloses an antenna integrated with a display panel, but fails to provide an efficient circuit connection as described above.

SUMMARY

According to an aspect of the present invention, there is provided an antenna package having improved operational reliability and signaling efficiency.

According to an aspect of the present invention, there is provided an image display device including an antenna package with improved operational reliability and signaling efficiency.

(1) An antenna package, including: a plurality of antenna units including first antenna units and second antenna units; and a circuit board electrically connected to the antenna units, wherein the circuit board comprises: a core layer comprising a first surface and a second surface facing each other; a first circuit wiring disposed on the first surface of the core layer and electrically connected to the first antenna units; and a second circuit wiring distributed on the first and second surfaces of the core layer and electrically connected to the second antenna units.

(2) The antenna package according to the above (1), wherein each of the first antenna units includes a first radiator, a first transmission line extending from the first radiator and a first signal pad connected to one end portion of the first transmission line, and each of the second antenna units includes a second radiator, a second transmission line extending from the second radiator and a second signal pad connected to one end portion of the second transmission line.

(3) The antenna package according to the above (2), wherein the first radiator and the second radiator have different sizes from each other.

(4) The antenna package according to the above (2), wherein the first transmission line and the second transmission line have different lengths from each other.

(5) The antenna package according to the above (2), wherein the first radiator and the second radiator have different resonance frequencies from each other.

(6) The antenna package according to the above (2), further including a first feeding port, wherein the first circuit wiring is connected to the first signal pad, and an end portion of the first circuit wiring is connected to the first feeding port.

(7) The antenna package according to the above (2), wherein the second circuit wiring includes: an antenna connection wiring disposed on the first surface of the core layer to be connected to the second signal pad; and a port connection wiring disposed on the second surface of the core layer.

(8) The antenna package according to the above (7), wherein the circuit board further includes a via structure penetrating the core layer and electrically connecting the antenna connection wiring and the port connection wiring to each other.

(9) The antenna package according to the above (8), wherein the circuit board comprises a via hole passing through the core layer, the antenna connection wiring and the port connection wiring, and the via structure is formed on a sidewall of the via hole to contact the antenna connection wiring and the port connection wiring.

(10) The antenna package according to the above (8), wherein the core layer includes a first core layer providing the first surface and a second core layer providing the second surface, and the circuit board further includes a ground layer disposed between the first core layer and the second core layer.

(11) The antenna package according to the above (10), wherein the circuit board further includes a blocking insulating layer disposed between the via structure and the ground layer.

(12) The antenna package according to the above (7), further including a second feeding port connected to an end portion of the port connection wiring.

(13) The antenna package according to the above (1), wherein the first antenna units and the second antenna units correspond to different resonance frequencies, and the first antenna units and the second antenna units are alternately and repeatedly arranged along a row direction.

(14) The antenna package according to the above (1), wherein the first circuit wiring and the second circuit wiring cross each other when projected in a planar view.

(15) The antenna package according to the above (1), wherein two or more of the first antenna units are coupled by the first circuit wiring and two or more of the second antenna units are coupled by the second circuit wiring.

(16) The antenna package according to the above (1), wherein the first circuit wiring includes a plurality of first circuit wirings that are individually connected to each of the first antenna units, and the second circuit wiring includes a plurality of second circuit wirings that are individually connected to each of the second antenna units.

(17) An image display device comprising the antenna package according to embodiments as described above.

According to embodiments of the present invention, signal wirings may be connected to first and second antenna units having different sizes using upper and lower surfaces of a circuit board. Accordingly, a substantially independent circuit connection with respect to the first antenna unit and the second antenna unit may be implemented, and signal and feeding loss due to a mutual signal interference may be prevented.

Additionally, the circuit connection to the first and second antenna units may be implemented from one circuit board, and thus a thinner antenna package may be obtained.

In some embodiments, the circuit board may further include a ground layer between an upper circuit wiring and a lower circuit wiring, so that a noise may be absorbed while suppressing a mutual interference between the upper circuit wiring and the lower circuit wiring by the ground layer.

DETAILED DESCRIPTION OF THE EMBODIMENTS

According to exemplary embodiments of the present invention, there is provided an antenna package in which antenna units having different sizes or frequencies, and a circuit board including a plurality of circuit wiring layers are combined. Further, an image display device including the antenna package is also provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

The terms "first", "second", "upper", "lower", "top", "bottom", etc., used herein do not designate an absolute position, but are intended to relatively distinguish different elements or positions.

Figure 1:
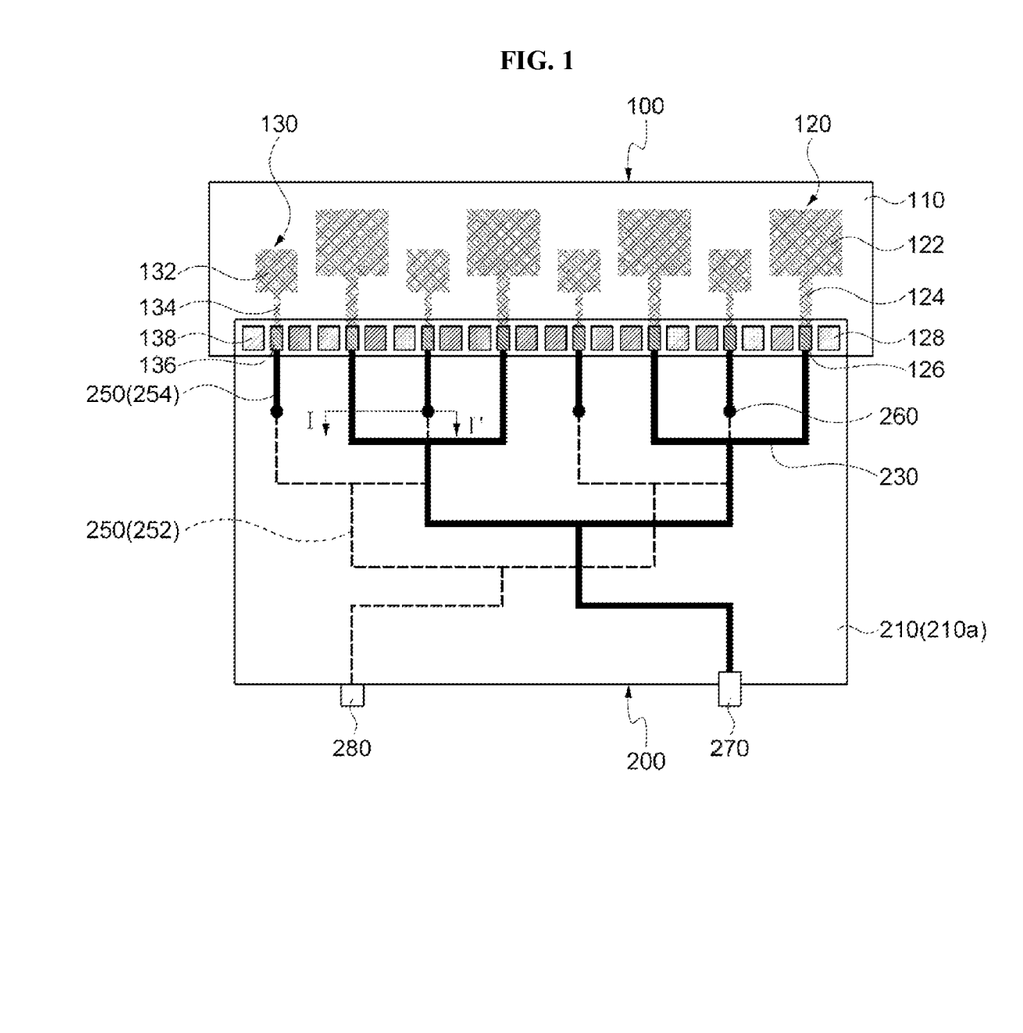
FIGS. 1 and 2 are schematic top planar views illustrating an antenna package in accordance with exemplary embodiments.
Figure 2:
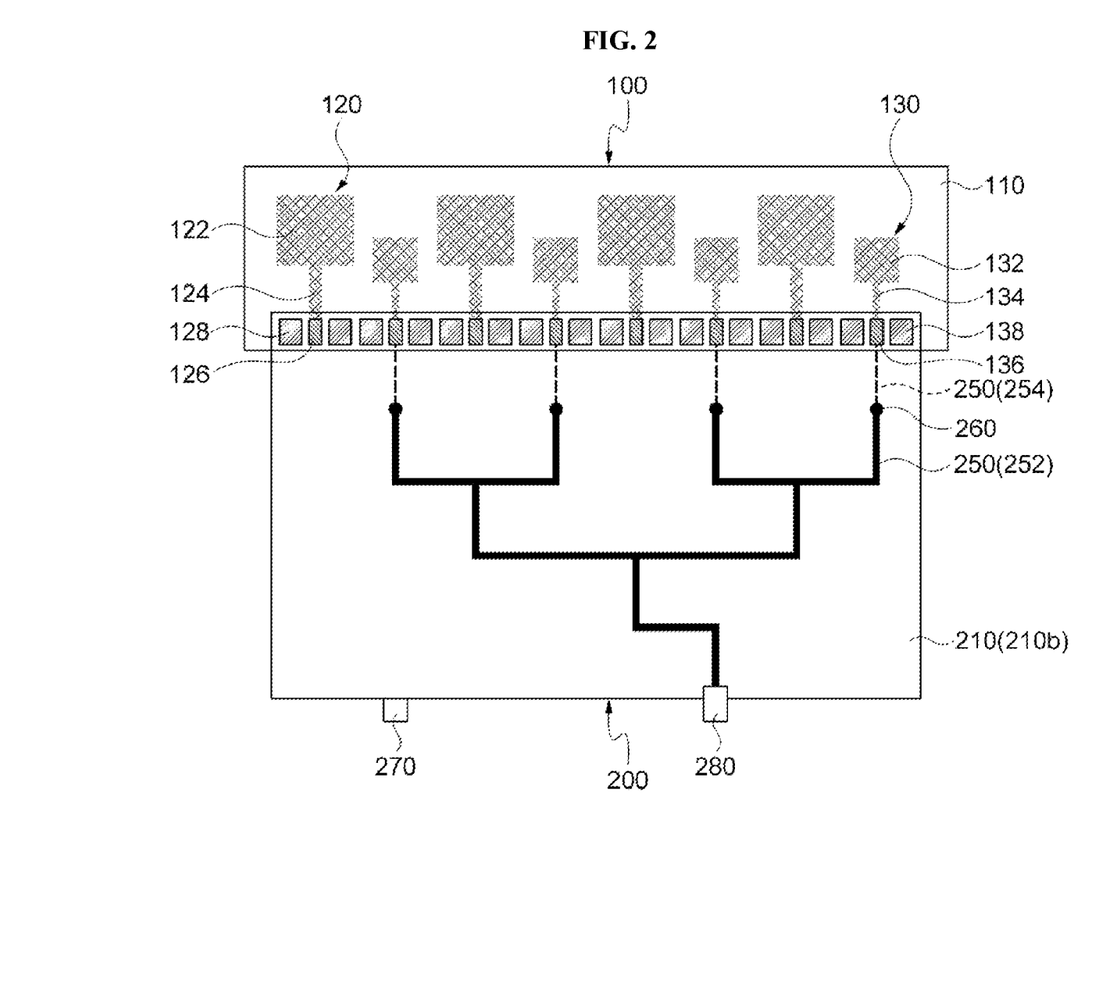

FIGS. 1 and 2 are schematic top planar views illustrating an antenna package in accordance with exemplary embodiments. For example, FIG. 1 is a planar view of an antenna package observed from a direction of a first surface 210a (e.g., a top surface or an upper surface) of the core layer 210 of the circuit board 200. FIG. 2 is a planar view of the antenna package observed from a second surface 210b (e.g., a bottom surface or a lower surface) of the core layer 210 of the circuit board 200.

FIGS. 1 and 2, the antenna package may include an antenna device 100 and a circuit board 200. The circuit board 200 may include circuit wirings 230 and 250, and the circuit wirings 230 and 250 may be electrically connected to an antenna unit included in the antenna device 100.

The antenna device 100 may include an antenna dielectric layer 110 and antenna units 120 and 130 disposed on the antenna dielectric layer 110.

The antenna dielectric layer 110 may include, e.g., a transparent resin film. For example, the dielectric layer 110 may include a polyester-based resin such as polyethylene terephthalate, polyethylene isophthalate, polyethylene naphthalate and polybutylene terephthalate; a cellulose-based resin such as diacetyl cellulose and triacetyl cellulose; a polycarbonate-based resin; an acrylic resin such as polymethyl (meth)acrylate and polyethyl(meth)acrylate; a styrene-based resin such as polystyrene and an acrylonitrile-styrene copolymer; a polyolefin-based resin such as polyethylene, polypropylene, a cycloolefin or polyolefin having a norbornene structure and an ethylene-propylene copolymer; a vinyl chloride-based resin; an amide-based resin such as nylon and an aromatic polyamide; an imide-based resin; a polyethersulfone-based resin; a sulfone-based resin; a polyether ether ketone-based resin; a polyphenylene sulfide resin; a vinyl alcohol-based resin; a vinylidene chloride-based resin; a vinyl butyral-based resin; an allylate-based resin; a polyoxymethylene-based resin; an epoxy-based resin; a urethane or acrylic urethane-based resin; a silicone-based resin, etc. These may be used alone or in a combination of two or more thereof.

The antenna dielectric layer 110 may include an adhesive material such as an optically clear adhesive (OCA), an optically clear resin (OCR), or the like. In some embodiments, the antenna dielectric layer 110 may include an inorganic insulating material such as silicon oxide, silicon nitride, silicon oxynitride, glass, or the like.

In some embodiments, a dielectric constant of the antenna dielectric layer 110 may be adjusted in the range from about 1.5 to 12. When the dielectric constant exceeds about 12, a driving frequency may be excessively reduced, and driving in a desired high frequency band may not be implemented.

The antenna units 120 and 130 may be formed on a top surface of the antenna dielectric layer 110. The antenna units 120 and 130 may include first antenna units 120 and second antenna units 130.

The first antenna unit 120 may include a first radiator 122 and a first transmission line 124. The second antenna unit 130 may include a second radiator 132 and a second transmission line 134. The radiators 122 and 132 have, e.g., a polygonal plate shape, and the first and second transmission lines 124 and 134 may extend from one side of the first and second radiators 122 and 132, respectively. The transmission lines 124 and 134 may be formed as a single member substantially integral with the radiators 122 and 132.

The first antenna unit 120 and the second antenna unit 130 may further include a first signal pad 126 and a second signal pad 136, respectively. The first signal pad 126 and the second signal pad 136 may be connected to one end of the first transmission line 124 and the second transmission line 134, respectively.

In an embodiment, the signal pads 126 and 136 may be provided as substantially integral members with the transmission lines 124 and 134, and end portions of the transmission lines 124 and 134 may be provided as the signal pads 126 and 136.

In some embodiments, ground pads 128 and 138 may be disposed around the signal pads 126 and 136. For example, a pair of first ground pads 128 may be disposed to face each other with the first signal pad 126 interposed therebetween. A pair of second ground pads 138 may be disposed to face each other with the second signal pad 136 interposed therebetween. The ground pads 128 and 138 may be electrically and physically separated from the transmission lines 124 and 134, and the signal pads 126 and 136.

In exemplary embodiments, the first antenna unit 120 and the second antenna unit 130 may have different sizes. In an embodiment, an area of the first radiator 122 included in the first antenna unit 120 may be larger than an area of the second radiator 132 included in the second antenna unit 130. In an embodiment, a length of the first transmission line 124 included in the first antenna unit 120 may be greater than a length of the second transmission line 134 included in the second antenna unit 130.

The first antenna unit 120 and the second antenna unit 130 may have different resonance frequencies. In exemplary embodiments, a resonance frequency of the first antenna unit 120 may be smaller than a resonance frequency of the second antenna unit 130. As a non-limiting example, the resonance frequency of the first antenna unit 120 may be from about 20 GHz to about 30 GHz (e.g., 28 GHz), and the resonance frequency of the second antenna unit 130 may be from about 30 GHz to 40 GHz (e.g., about 38 GHz).

As illustrated in FIGS. 1 and 2, the first antenna units 120 and the second antenna units 130 having different sizes and/or resonance frequencies may be alternately and repeatedly arranged in a row direction. Accordingly, uniformity of radiation coverage over an entire area of the antenna device 100 may be improved.

The antenna units 120 and 130 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) or an alloy containing at least one of the metals. These may be used alone or in a combination thereof.

In an embodiment, the antenna units 120 and 130 may include may include silver (Ag) or a silver alloy (e.g., silver-palladium-copper (APC)), or copper (Cu) or a copper alloy (e.g., a copper-calcium (CuCa)) to implement a low resistance and/or a fine line width pattern.

In some embodiments, the antenna units 120 and 130 may include a transparent conductive oxide such indium tin oxide (ITO), indium zinc oxide (IZO), zinc oxide (ZnOx), indium zinc tin oxide (IZTO), etc.

In some embodiments, the antenna units 120 and 130 may include a multi-layered structure of a transparent conductive oxide layer and a metal layer. For example, the antenna units 120 and 130 may include a double-layered structure of a transparent conductive oxide layer-metal layer, or a triple-layered structure of a transparent conductive oxide layer-metal layer-transparent conductive oxide layer.

In this case, the flexible property is improved by the metal layer and a signal transmission speed may be improved by a low resistance of the metal layer. Corrosion resistance and transparency may be improved by the transparent conductive oxide layer.

In some embodiments, the radiators 122 and 132 and the transmission lines 124 and 134 may include a mesh-pattern structure to improve transmittance. In this case, a dummy mesh pattern (not illustrated) may be formed around the radiators 122 and 132 and the transmission lines 124 and 134.

The signal pads 126 and 136 and the ground pads 128 and 138 may be formed as a solid pattern formed of the above-described metal or alloy in consideration of reducing a feeding resistance, improving an efficiency of a noise absorption efficiency, providing a horizontal radiation property, etc.

The circuit board 200 may include a core layer 210 and the circuit wirings 230 and 250 formed on surfaces of the core layer 210. For example, the circuit board 200 may be a flexible printed circuit board (FPCB).

The core layer 210 may include, e.g., a flexible resin such as a polyimide resin, Modified Polyimide (MPI), an epoxy resin, polyester, a cycloolefin polymer (COP), a liquid crystal polymer (LCP), or the like.

The core layer 210 may include a first surface 210a and a second surface 210b facing each other. For example, the first surface 210a and the second surface 210b may correspond to an upper surface and a lower surface of the core layer 210, respectively.

The circuit wirings may include a first circuit wiring 230 and a second circuit wiring 250. The first circuit wiring 230 may be formed on the first surface 210a of the core layer 210.

In exemplary embodiments, the first circuit wiring 230 may be electrically connected to the first signal pads 126 of the first antenna units 120. For example, one end portions of the first circuit wiring 230 and the first signal pads 126 may be electrically connected by pressing each other with an intermediate conductive structure (not illustrated) such as an anisotropic conductive film (ACF) interposed therebetween.

As illustrated in FIG. 1, a pair of the first antenna units 120 may be coupled by the first circuit wiring 230 to define a first antenna unit group. Additionally, a pair of the first antenna unit groups may be coupled again by the first circuit wiring 230.

A terminal end portion of the first circuit wiring 230 may be connected to a first feeding port 270. For example, an antenna driving integrated circuit (IC) chip may be connected to the circuit board 200 through the first feeding port 270 to transmit a power and a control signal to the first antenna units 120.

The second circuit wiring 250 may be electrically connected to the second signal pads 136 of the second antenna units 130. In exemplary embodiments, the second circuit wiring 250 may be distributed on the first surface 210a and the second surface 210b of the core layer 210. For example, the second circuit wiring 250 may include an antenna connection wiring 254 disposed on the first surface 210a of the core layer 210 and a port connection wiring 252 disposed on the second surface 210b of the core layer 210.

The antenna connection wiring 254 may be disposed to be adjacent to the second antenna unit 130, and one end portion of the antenna connection wiring 254 may be connected to each of the second signal pads 136. For example, the one end portions of the antenna connection wiring 224 and the second signal pads 136 may be electrically connected by pressing each other with the intermediate conductive structure (not illustrated) interposed therebetween.

The port connection wiring 252 may extend on the second surface 210b of the core layer 210. A terminal end portion of the port connection wiring 252 may be connected to a second feeding port 280. For example, an antenna driving integrated circuit (IC) chip may be connected to the circuit board 200 through the second feeding port 280 to transmit a power and a control signal to the second antenna units 130.

As illustrated in FIGS. 1 and 2, a pair of the second antenna units 130 may be coupled by the second circuit wiring 250 to define a second antenna unit group. A pair of the second antenna unit groups may be coupled again by the second circuit wiring 250. Accordingly, a feeding and a driving control may be performed to a plurality of the second antenna units 130 through the second feeding port 280.

The circuit connection structure of the first antenna units 120 and the second antenna units 130 illustrated in FIGS. 1 and 2 is provided as an exemplary embodiment, and may be properly modified in consideration of a size of the antenna device 100 and a construction of the image display device to which the antenna package is applied. For example, three or more first antenna units 120 may be coupled by the first circuit wiring 230 to define the first antenna group, and three or more second antenna units 130 may be coupled by the second circuit wirings 250 to defined the second antenna group.

In exemplary embodiments, the antenna connection wiring 254 and the port connection wiring 252 of the second circuit wiring 250 may be electrically connected to each other through a via structure 260. For example, the via structure 260 may be formed through the core layer 210 to connect the antenna connection wiring 254 and the port connection wiring 252 positioned at different layers or different levels.

Accordingly, even when the first and second antenna units 120 and 130 having different resonance frequencies are distributed together, independent circuit connection for each of the first antenna units 120 and the second antenna units 130 may be implemented using the upper and lower surfaces of the core layer 210 without a short circuit or a signal interference.

Further, an increase of a length of a signal path caused by a circuit bypass at the same plane for avoiding a mutual circuit interference may be prevented. Thus, a signal loss from the circuit wiring may be reduced or suppressed during a feeding/signal transfer to the antenna units 120 and 130.

For example, as illustrated in FIG. 1, when projected in a planar direction, the first and second circuit wirings 230 and 250 may be arranged to cross each other. Thus, a shortened signal path may be obtained without the circuit bypass for avoiding the short circuit.

In exemplary embodiments, the circuit connection to the antenna units 120 and 130 having different resonance frequencies may be implemented using one circuit board 200. Accordingly, an antenna package having a thinner structure and improved flexibility may be provided when compared to a case in which circuit boards are connected to each of the first antenna units 120 and the second antenna units 130.

In some embodiments, the antenna driving IC chip may be directly mounted on the circuit board 200 and may be electrically connected to the feeding ports 270 and 280 or the signal pads 126 and 136. In some embodiments, for example, a rigid printed circuit board may be stacked/connected on the circuit board 200, and the antenna driving IC chip may be mounted on the rigid printed circuit board.

In FIGS. 1 and 2, the antenna units 120 and 130 are grouped or coupled by the circuit wirings 230 and 250, but the present invention is not limited to the construction. For example, a plurality of the first circuit wirings 230 may be individually connected to each of the first antenna units 120 via the first signal pad 126. Further, a plurality of the second circuit wirings 250 may be individually connected to each of the second antenna units 130 via the second signal pad 136.

As illustrated in FIGS. 1 and 2, in the circuit board 200, the core layer 210 may serve as an insulating substrate layer for forming the circuit wirings 230 and 250.

In some embodiments, the circuit board 200 may further include a substrate layer. For example, the port connection wiring 252 and the core layer 210 may be sequentially stacked from the substrate layer, and the first circuit wiring 230 and the antenna connection wiring 254 may be stacked on the core layer 210. In this case, the core layer 210 may serve as an inner insulating layer of the circuit board 200.

Figure 3:
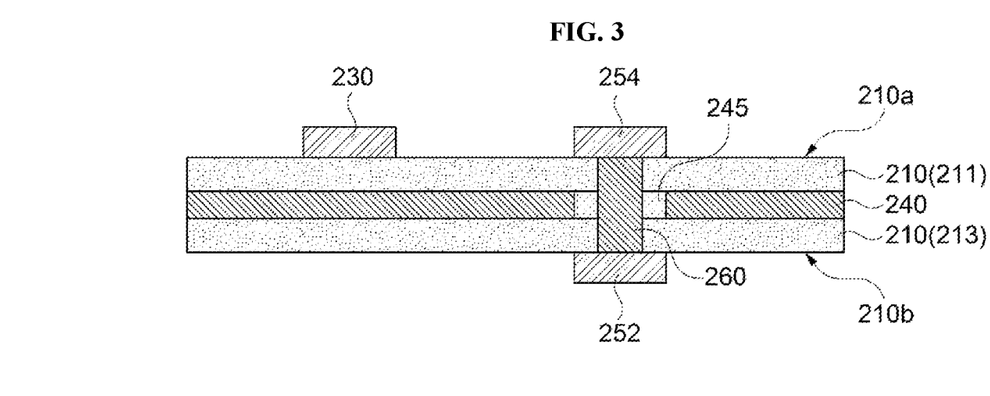
FIG. 3 is a schematic cross-sectional view illustrating a circuit board included in an antenna package in accordance with exemplary embodiments.
Figure 4:
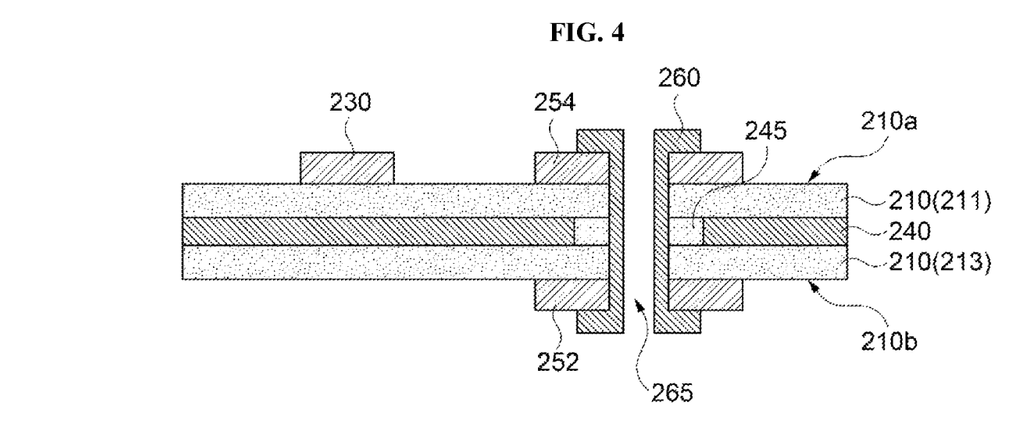
FIG. 4 is a schematic cross-sectional view illustrating a circuit board included in an antenna package in accordance with exemplary embodiments.

FIGS. 3 and 4 are schematic cross-sectional views illustrating a circuit board included in an antenna package in accordance with exemplary embodiments. For example, FIGS. 3 and 4 are schematic cross-sectional views taken along a line I-I' of FIG. 1 in a thickness direction of the circuit board 200.

Referring to FIG. 3, as described above, the via structure 260 may be formed through the core layer 210 to electrically connect the antenna connection wiring 254 and the port connection wiring 252 to each other.

In exemplary embodiments, a ground layer 240 may be further included in the core layer 210. Accordingly, a vertical signal interference that may be caused between the second circuit wiring 250 (the port connection wiring 252) disposed on the second surface 210b of the core layer 210 and the first circuit wiring 230 disposed on the first surface 210a of the core layer 210 may be shielded.

For example, the core layer 210 may include a first core layer 211 providing the first surface 210a and a second core layer 213 providing the second surface 210b. The ground layer 240 may be disposed between the first core layer 211 and the second core layer 213.

The circuit board 200 or the core layer 210 may further include a blocking insulating layer 245 that may horizontally contact the ground layer 240. For example, the blocking insulating layer 245 may be disposed between the ground layer 240 and the via structure 260 at an inside of the core layer 210, and may insulate the ground layer 240 and the via structure 260 from each other.

Referring to FIG. 4, a via hole 265 penetrating the core layer 210 may be formed. In some embodiments, the via hole 265 may pass commonly through the antenna connection wiring 254 and the port connection wiring 252.

The via structure 260 may be formed on a sidewall of the via hole 265 and may contact the antenna connection wiring 254 and the port connection wiring 252. For example, the via structure 260 may be formed by a chemical plating process such as copper plating.

In some embodiments, the via structure 260 may substantially completely fill the via hole 265. In some embodiments, the via structure 260 may at least partially cover a top surface of the antenna connection wiring 254 and a bottom surface of the port connection wiring 252.

As described above, a vertical connection of the second circuit wiring 250 may be implemented by a via hole (or a through hole) formation process and a via connection process including a plating process using the single circuit board 200. Additionally, the ground layer 240 may be insulated from the via structure 260 and may be inserted into the core layer 210, so that a mutual interference between the first and second circuit wirings 230 and 250 may be prevented, and a reliability of the feeding/signal transfer may be further improved.

Figure 5:
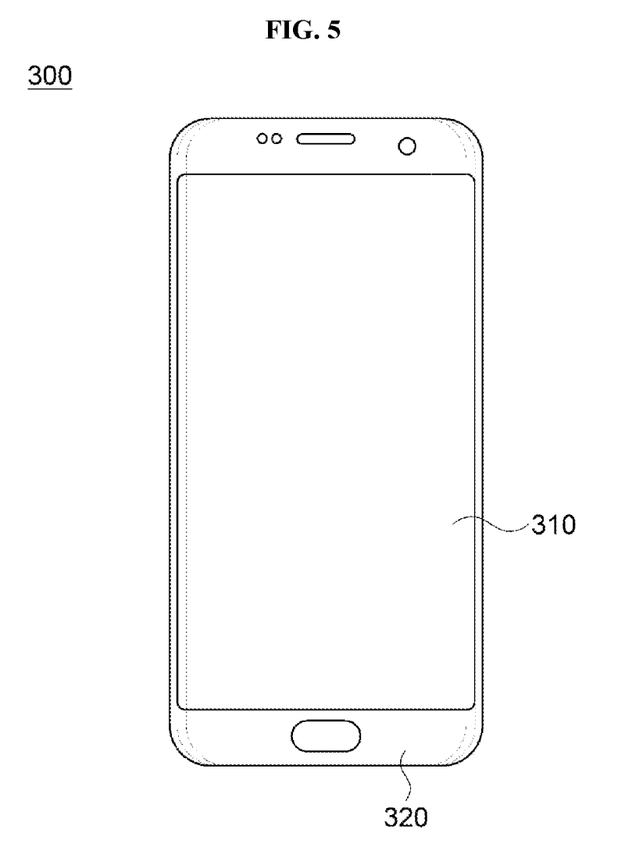
FIG. 5 is a schematic top planar view illustrating an image display device in accordance with exemplary embodiments.

FIG. 5 is a schematic top planar view illustrating an image display device in accordance with exemplary embodiments.

Referring to FIG. 5, the image display device 300 may be implemented in a form of, e.g., a smart phone, and FIG. 5 shows a front-face portion or a window surface of the image display device 300. The front-face portion of the image display device 300 may include a display area 310 and a peripheral area 320. The peripheral area 320 may correspond to, e.g., a light-shielding portion or a bezel portion of the image display device.

The antenna device 100 included in the above-described antenna package may be disposed toward the front-face portion of the image display device 300, and may be disposed on, e.g., a display panel. In an embodiment, the radiators 122 and 132 may at least partially overlap the display area 310.

In this case, the radiators 122 and 132 may include a mesh-pattern structure, and a decrease in transmittance due to the radiators 122 and 132 may be prevented. The antenna driving IC chip included in the antenna package may be disposed in the peripheral area 320 to prevent an image quality deterioration in the display area 310.

In some embodiments, the antenna package may be bent using the circuit board 200 so that, for example, the antenna driving IC chip may be disposed on a rear-face portion of the image display device 300.

As described above, a multi-band antenna corresponding to a plurality of resonance frequencies may be effectively applied in the image display device 300 without the mutual interference between different frequencies or different bands using the circuit wiring design in the circuit board 200.

What is claimed is:

1. An antenna package, comprising:
   a plurality of antenna units including first antenna units and second antenna units; and
   a circuit board electrically connected to the antenna units, wherein the circuit board comprises:
   a core layer comprising a first surface and a second surface facing each other;
   a first circuit wiring disposed on the first surface of the core layer and electrically connected to the first antenna units; and
   a second circuit wiring distributed on the first and second surfaces of the core layer and electrically connected to the second antenna units,
   wherein each of the first antenna units comprises a first radiator, a first transmission line extending from the first radiator and a first signal pad connected to one end portion of the first transmission line, and
   each of the second antenna units comprises a second radiator, a second transmission line extending from the second radiator and a second signal pad connected to one end portion of the second transmission line,
   wherein the second circuit wiring comprises an antenna connection wiring disposed on the first surface of the core layer to be connected to the second signal pad; and
   a port connection wiring disposed on the second surface of the core layer.

2. The antenna package according to claim 1, wherein the first radiator and the second radiator have different sizes from each other.

3. The antenna package according to claim 1, wherein the first transmission line and the second transmission line have different lengths from each other.

4. The antenna package according to claim 1, wherein the first radiator and the second radiator have different resonance frequencies from each other.

5. The antenna package according to claim 1, further comprising a first feeding port, wherein the first circuit wiring is connected to the first signal pad, and an end portion of the first circuit wiring is connected to the first feeding port.

6. The antenna package according to claim 1, wherein the circuit board further comprises a via structure penetrating the core layer and electrically connecting the antenna connection wiring and the port connection wiring to each other.

7. The antenna package according to claim 6, wherein the circuit board comprises a via hole passing through the core layer, the antenna connection wiring and the port connection wiring, and the via structure is formed on a sidewall of the via hole to contact the antenna connection wiring and the port connection wiring.

8. The antenna package according to claim 6, wherein the core layer comprises a first core layer providing the first surface and a second core layer providing the second surface, and the circuit board further comprises a ground layer disposed between the first core layer and the second core layer.

9. The antenna package according to claim 8, wherein the circuit board further comprises a blocking insulating layer disposed between the via structure and the ground layer.

10. The antenna package according to claim 1, further comprising a second feeding port connected to an end portion of the port connection wiring.

11. The antenna package according to claim 1, wherein the first antenna units and the second antenna units correspond to different resonance frequencies, and the first antenna units and the second antenna units are alternately and repeatedly arranged along a row direction.

12. The antenna package according to claim 1, wherein the first circuit wiring and the second circuit wiring cross each other when projected in a planar view.

13. The antenna package according to claim 1, wherein two or more of the first antenna units are coupled by the first circuit wiring and two or more of the second antenna units are coupled by the second circuit wiring.

14. The antenna package according to claim 1, wherein the first circuit wiring comprises a plurality of first circuit wirings that are individually connected to each of the first antenna units, and the second circuit wiring comprises a plurality of second circuit wirings that are individually connected to each of the second antenna units.

15. An image display device comprising the antenna package according to claim 1.

* * * * *